United States Patent [19]

Lin et al.

[11] Patent Number: 4,961,828

[45] Date of Patent: Oct. 9, 1990

[54] TREATMENT OF METAL FOIL

[75] Inventors: Lifun Lin, Hamden; Ned W. Polan, Madison, both of Conn.

[73] Assignee: Olin Corporation, Cheshire, Conn.

[21] Appl. No.: 333,212

[22] Filed: Apr. 5, 1989

[51] Int. Cl.$^5$ .......................... C25D 5/34; C25D 7/06
[52] U.S. Cl. ...................................... 204/27; 204/29; 204/35.1
[58] Field of Search .......................... 204/27, 29, 35.1

[56] References Cited

U.S. PATENT DOCUMENTS

| | | | |
|---|---|---|---|
| Re. 30,180 | 12/1979 | Wolski et al. | 428/601 |
| 2,030,601 | 2/1936 | McDonald | 148/6.5 |
| 2,412,543 | 12/1946 | Tanner | 204/35 |
| 2,418,608 | 4/1947 | Thompson et al. | 148/6 |
| 2,647,865 | 8/1953 | Freud | 204/33 |
| 3,220,897 | 11/1965 | Conley et al. | 148/34 |
| 3,293,109 | 12/1966 | Luce et al. | 161/166 |
| 3,322,656 | 5/1967 | Dahringer et al. | 204/38 |
| 3,585,010 | 6/1971 | Luce et al. | 29/191.2 |
| 3,625,844 | 12/1971 | McKean | 204/140 |
| 3,677,828 | 7/1972 | Caule | 148/6.15 R |
| 3,699,018 | 10/1972 | Carlson | 104/52 R |
| 3,716,427 | 2/1973 | Caule | 156/3 |
| 3,764,400 | 10/1973 | Caule | 148/6.16 |
| 3,853,716 | 12/1974 | Yates et al. | 204/28 |
| 3,857,681 | 12/1974 | Yates et al. | 29/195 |
| 3,918,926 | 11/1975 | Wolski et al. | 295/195 |
| 4,049,481 | 9/1977 | Morisaki | 156/151 |
| 4,053,370 | 10/1977 | Yamashita et al. | 204/13 |
| 4,131,517 | 12/1978 | Mitsuo et al. | 204/27 |
| 4,387,006 | 6/1983 | Kajiwara et al. | 204/32 R |
| 4,432,846 | 2/1984 | Honeycutt, III | 204/129.95 |
| 4,468,293 | 8/1984 | Polan et al. | 204/27 |
| 4,515,671 | 5/1985 | Polan et al. | 204/228 |
| 4,529,486 | 7/1985 | Polan | 204/13 |
| 4,532,014 | 7/1985 | Polan et al. | 204/28 |
| 4,549,950 | 10/1985 | Polan et al. | 204/206 |
| 4,568,431 | 2/1986 | Polan et al. | 204/13 |
| 4,647,315 | 3/1987 | Parthasarathi et al. | 148/6.16 |
| 4,652,346 | 3/1987 | Polan | 204/15 |
| 4,789,438 | 12/1988 | Polan | 204/13 |

FOREIGN PATENT DOCUMENTS

| | | |
|---|---|---|
| 112145 | 3/1975 | Fed. Rep. of Germany . |
| 1211494 | 11/1970 | United Kingdom . |
| 1293801 | 10/1972 | United Kingdom . |
| 2030176A | 4/1980 | United Kingdom . |
| 2073779A | 10/1981 | United Kingdom . |

OTHER PUBLICATIONS

U.S. Patent Application Ser. No. 07/453,370, filed Dec. 22, 1989; Continuation of U.S. Patent Application Ser. No. 07/333,210, filed Apr. 5, 1989—Lin et al.—for "Anti-tarnish Treatment of Metal Foil".

Primary Examiner—T. M. Tufariello
Attorney, Agent, or Firm—H. Samuel Kieser

[57] ABSTRACT

A treatment for metal foil, particularly copper or copper alloy foil, to be used in electrical and electronic applications wherein the bond strength of the foil is improved. The treatment includes applying an aqueous solution of chromic acid phosphoric acid to the foil, rinsing the foil in an aqueous solution having a pH of at least 8 and thereafter forming a plurality of copper or copper oxide dendritic structures on at least one side of the foil. The foil may be further treated by applying a coating of zinc or other suitable material over the dendritic structure and an anti-tarnish treatment applied. The anti-tarnish treatment includes applying a thin coating of zinc to the smooth side of the foil followed by treating the foil with a chromic acid sulfuric acid solution to provide a layer of chromate on both surfaces. The foil is then further treated by rinsing with an aqueous solution of a pH of at least 8 and dried.

31 Claims, 2 Drawing Sheets

TREATMENT OF METAL FOIL

The present invention relates to a method and system for treating metal sheet, strip or foil to improve its ability to adhere to a substrate material. More particularly, this invention relates to a method and system wherein one or both of the surfaces of copper sheet or foil is treated to improve its ability to adhere to a resinous substrate.

Printed circuits are widely used in various electronic devices such as radios, televisions and electronic computers, etc. In the production of printed circuits it is desirable to use copper, preferably in foil form, because of copper's high electrical conductivity.

In producing printed circuits, it is a common practice to bond the metal foil to a substrate material, generally with an adhesive, and to subject the composite structure to an etching treatment to form the desired circuit. Because the adhesion between the metal foil and the substrate is weak, considerable effort has been directed toward the treatment of the metal foil so as to increase its bond strength with the substrate. As a result of such efforts, a variety of treatments have been developed which result in the formation of a roughened surface on at least one surface of the metal foil. When the metal foil being used is a copper foil, these treatments generally comprise electrodepositing a dendritic copper layer on the surface so that when laminated to the substrate material, the treated surface will form a tenacious bond, primarily a mechanical bond, with the substrate material.

In most of dendritic copper treatments, a nodular powdery copper layer, primarily copper or copper oxide is formed on the surface of a metal foil. This layer may be in the form of random nodular clusters which increase the foil surface area. In some treatments a second layer called a locking layer is electrodeposited over the nodular layer. This locking layer is generally non-nodular in nature and generally conforms to the configuration of the dendritic layer. The function of the locking layer is to reduce the powder transfer characteristics of the dendritic layer and to maintain the configuration of dendritic surface projections intact during the subsequent circuit fabrication steps such as lamination of the treated metal to a substrate. The locking layer may be a layer of copper or copper alloy or a layer of some other alloy such as nickel, cobalt, zinc, chromium, and alloys thereof. Illustrative of these prior art treatments are those shown in U.S. Pat. No. 3,220,897 to Conley et al, U.S. Pat. No. 3,293,109 to Luce et al, U.S. Pat. No. 3,322,656 to Dahringer et al, U.S. Pat. No. 3,585,010 to Luce et al, U.S. Pat. No. 3,699,018 to Carlson, U.S. Pat. No. 3,857,681 to Yates et al, U.S. Pat. No. 3,918,926 to Wolski et al, U.S. Pat. No. 4,049,481 to Morisaki, U.S. Pat. No. 4,053,370 to Yamashita et al and U.S. Pat. No. Re. 30,180 to Wolski et al, German Democrat Republic Pat. Document No. 112,145 and U.K. Pat. No. 1,211,494.

Recently, a technique has been developed for applying a dendritic copper treatment to copper or copper alloy foil using a current having regularly recurring pulses. In this technique, copper dendrites are formed on at least one surface of the copper or copper alloy foil during a first portion of each pulse and are bonded to the surface during a second portion of each pulse. It has been discovered that this technique, illustrated in U.S. Pat. No. 4,468,293 to Polan et al, forms well-bonded dendritic structures that significantly improve the adhesion properties of the treated foil.

It has been found that the process of the U.S. Pat. No. 4,468,293 works extremely well on smooth surface materials. However, when the surface is rough or irregular, the nodules or dendrites formed during the process do not generally occur uniformly over the entire surface. The nodules or dendrites are preferentially deposited on the high points or crests of the features on the surface. This phenomenon occurs relatively severely on the solution side which is the side facing the anode and opposite of the side facing the drum of electrodeposited foil which has a typical surface roughness of about 10 micro inches to 500 micro inches and on wrought foil of surface roughness greater than about 12 micro inches.

In accordance with the present invention, a technique is provided whereby more uniformly distributed nodules or dendrites can be deposited on a surface of an electrodeposited or wrought metal foil. This technique comprises chemical pretreating of the foil before deposition of the dendritic structures.

With the technique of pretreating the foil according to the present invention, the overall profile of the treated foil is lower as the excessively large nodules or clusters of nodules at the high points of the foil are eliminated. This permits relatively thinner foils, thinner substrates and narrower circuit lines and spaces. Additionally, there is a reduction of the tendency for the breaking off and encapsulating of the treatment nodules in the resinous substrate during lamination. Further, the technique of the present invention results in relative increases in the peel strength of the foil.

According to the invention described herein, a method for treating metal foil may comprise applying an aqueous chromic acid or chromic acid-phosphoric acid solution to the foil, with the solution having a concentration of chromic acid in the range of about 0.002 gram per liter (hereinafter g/l) to about 1.00 g/l and a concentration of phosphoric acid in the range of 0.002 g/l to about 1.00 g/l. The foil maybe rinsed in an aqueous rinse solution having a pH of at least 8 and thereafter a plurality of copper or copper oxide dendritic or nodular structures are formed on at least one surface of the foil.

It is an object of the present invention to provide a treatment for increasing the adhesive properties of a metallic sheet or foil.

It is a further object of the present invention to provide an improved process and system for treating foil which results in a dendritic or nodular layer being formed on at least one surface of the foil and which is more uniformly distributed.

These and other objects of the present invention will become more apparent from the following description and to the accompanying drawings in which.

In accordance with this invention, a process for treating metal sheet or foil for enhancing its ability to adhere to a substrate, particularly a nonmetallic substrate is provided. Although applicable to many metals or alloys, the process of the instant invention is particularly useful for treating sheet or foil made of copper and copper alloys. Laminates having high peel strength, which are particularly suitable for printed circuit applications, can be achieved through the use of the process and systems of the present invention.

Figure 1:
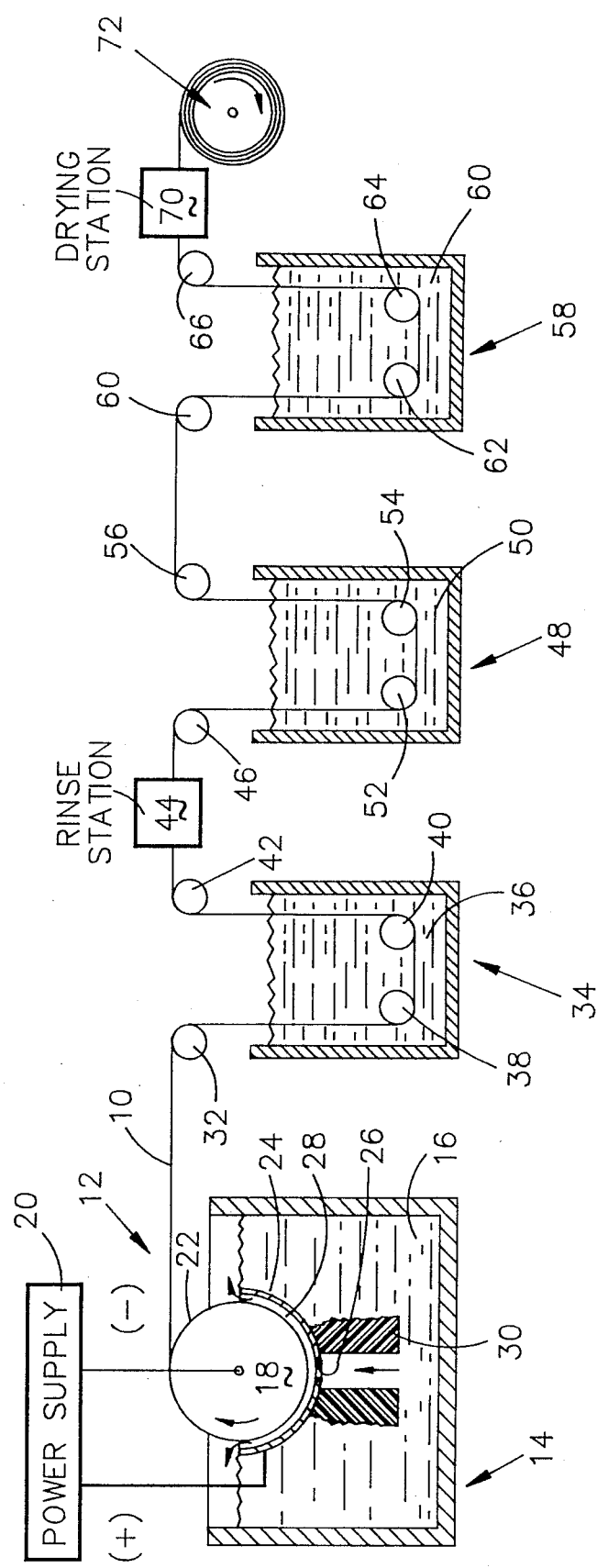
FIG. 1 is a schematic representation of a system for treating foil in accordance with the present invention and showing a first stage of treatment.
Figure 2:
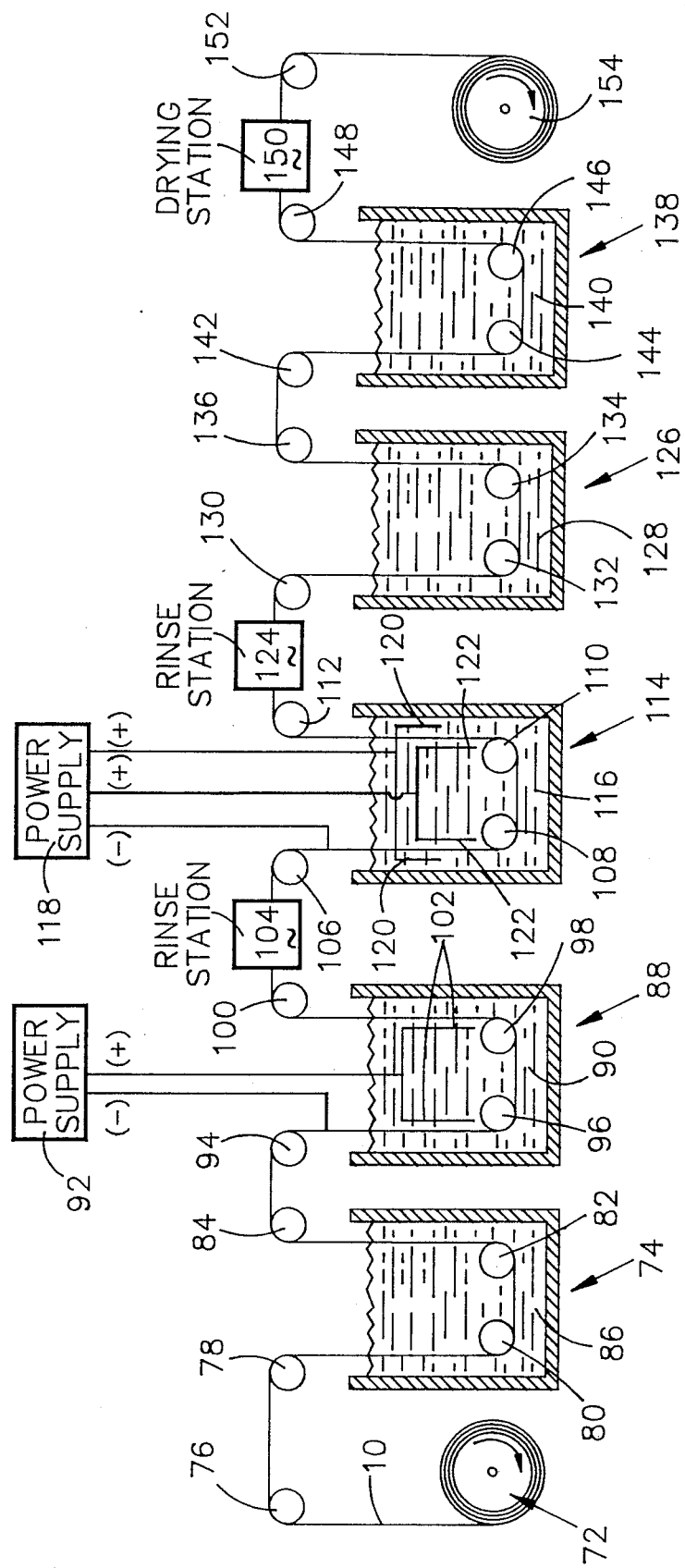
FIG. 2 is a schematic representation of a system in accordance with the present invention for treating metal foil and showing a second stage of treatment.

Referring now to FIGS. 1 and 2, a system for producing treated copper or copper alloys foils is illustrated. The copper or copper alloy foil may either be electrodeposited or wrought foil, However, according to the preferred embodiment, as shown herein, the foil is electrodeposited foil.

The electrodeposited foil 10 may be produced according to any of the methods disclosed, and with any of the apparatus shown in U.S. Pat. Nos. 4,529,486, 4,532,014, 4,549,950, 4,568,431 and 4,652,346. In general, an electrodeposition system 12 for producing the metal foil 10 may comprise a plating tank 14 designed to hold an electrolyte 16. A rotating metal drum 18 is connected to a suitable power supply 20. The drum 18 is connected to the negative terminal of the direct current power supply 20 and serves as the cathode.

The drum 18 may be formed from any suitable electrically conductive metal or metal alloy including but not limited to lead, stainless steel, columbium, tantalum, titanium, chromium, and alloys thereof. According to a preferred embodiment, the drum 18 comprises a stainless steel drum having a plating surface 22 formed from titanium or titanium alloys. The plating surface is preferably finished with an isotopic finish as disclosed in U.S. Pat. No. 4,789,438. The drum cathode 18 may be rotated by suitable drive motor (not shown) known in the art.

An anode 24 has an arcuated shape and a central perforated zone 26 and is connected to the positive terminal of the power supply 20. The anode 24 may be formed from any suitable preferably insoluble electrically conductive metal or metal or metal alloy. Preferred anode materials include lead, alloys of lead and antimony or alloys of lead antimony and silver. Other preferred anode materials include dimensionally stable materials such as platinum, clad metals and centered transition element oxides coating a base material such as titanium. If desired, the central perforated zone 26 may be formed from a different material than the rest of the anode 24. The anode is described in more detail in U.S. Pat. No. 4,529,486 which is hereby incorporated by reference herein in its entirety.

The anode 24 may be mounted in the tank 14 by any suitable means (not shown) known in the art. Generally the anode 24 is mounted in a way which provides a substantially uniform interelectrode gap 28 with the moving plating surface 22 of the drum cathode 18. The electrode gap 28 is kept small to limit voltage increases due to electrolyte resistance.

The electrolyte solution 16 generally comprises an aqueous solution containing a concentration of metal ions to be deposited on the cathode plating surface of the rotating drum 18. For example, if copper foil is to be formed, the electrolyte would contain a concentration of copper ions, and preferably comprises a copper sulfate-sulfuric acid solution. The compositional specifics of the copper sulfate-sulfuric acid solution and the temperature ranges which it may be used are more fully described in the U.S. Pat. No. 4,529,486 to Polan.

In operation, the drum cathode 18 is rotated at the desired speed and a current having a suitable current density is applied between the cathode and the anode. The electrolyte 16 is circulated upward through a manifold 30 into the interelectrode gap 28 and permitted to spill over the edges of the anode 24 back into the tank 14. While the plating surface 22 is immersed in electrolyte and a current is being applied, metal is deposited thereon. The metal deposit generally takes the form of a relatively thin, relatively smooth, continuous strip of metal foil 10. After the plating surface 22 emerges from the electrolyte 16, the metal foil 10 is removed or peeled from the surface.

After the foil 10 is stripped from the drum, it passes over an exit roll 32 and into a tank 34 containing a dilute acid solution 36. The tank is provided with a series of rolls 38, 40 arranged to make the foil 10 bend and loop through the solution 36 in the tank 34. Preferably, the solution is a dilute sulfuric acid solution that is maintained at ambient temperature. Concentration of the solution may be between about 5 to about 15 weight percent $H_2SO_4$. The speed of the line and the spacing of the rolls 38, 40 and the depth of solution in the tank 34 may be adjusted so that the resident time of the immersion of the foil 10 in the sulfuric acid solution 36 is from about 5 to about 20 seconds. This rinse treatment serves to pickle the foil and to clean the surface and remove any copper oxide which may have formed.

After emerging from the dilute sulfuric acid solution, the foil may be passed over a roll 42 and through a rinse station 44. The rinse station 44 serves to remove any loose particles on the foil and washes away any unwanted chemicals left during the previous treatment to prevent downstream chemical solutions from being contaminated. Deionized $H_2O$ is preferably used for the rinse. The rinse station will be described more fully hereinafter.

After rinsing, the foil 10 is subject to a passivation or anti-tarnish treatment before being transferred to the final treatment line which renders its surface less active. The anti-tarnish treatment is accomplished by passing the foil 10 over a roll 46 into a treatment tank 48 containing a dilute aqueous chromic acid-phosphoric acid solution 50. Solutions in accordance with the present invention contain chromic acid in a concentration of about 0.002 grams per liter to about 1.00 gram per liter and phosphoric acid in the concentration in the range of about 0.002 grams per liter to about 1 grams per liter. Generally the solutions contain no other constituents besides water and some minor impurities. Preferred embodiments of the solution consist essentially of from about 0.1 grams per liter to about 0.3 grams per liter of chromic acid, from about 0.1 grams per liter to about 0.7 grams per liter of phosphoric acid and the balance essentially water.

While the treatment of the foil may applied with the phosphoric-chromic acid solution at any desired temperature, it is preferred that the solution 50 in the tank 48 be maintain at a temperature in range from $40 +/- 3°$ C. If necessary, the tank 48 may also be provided with any suitable means known in the art such as heating-/cooling loop for maintaining the solution at a desired temperature. A plurality rolls 52, 54, 56 may be mounted to and in the tank 48 to define the path by which the foil 10 tracks through the tank. It is also preferred to keep the foil immersed in the solution for a time in the range of about 1 second to about 120 seconds, most preferably from about 10 seconds to about 30 seconds.

Although the use of a solution of chromic acid and phosphoric acid is preferred, a solution of chromic acid may also be used. In such case, the concentration of the chromic acid may be in the range of from about 0.02 g/l to about 0.1 g/l to about 0.3 g/l.

After treatment of the foil 10 with the chromic acid-phosphoric acid solution, the foil may be further treated by rinsing the foil 10 in a dilute basic rinse solution immediately after the foil exits the tank 48. This may be accomplished by immersing the foil 10 in a tank 58 containing a dilute basic solution 60 having a pH greater than about 8. A plurality of rolls 60, 62, 64, 66 may be mounted to and in the tank to define a path by which the foil 10 tracks through the tank 58.

Dilute basic solutions in accordance with the present invention comprise aqueous solutions having a pH of at least about 8. Solutions of particular benefit are those having a pH in the range of about 9 to 11.5. Any suitable addition agent may be employed to adjust the pH of this solution. Generally, the addition will be selected from the group consisting of the salts of alkali metals, the salts of alkaline earth metals, the hydroxides of the alkali metals, and the hydroxides of the alkaline earth metals. A preferred addition agent is one selected from a group consisting of sodium hydroxide, calcium hydroxide, potassium hydroxide, and ammonium hydroxide. While the amount of addition agent present in the solution will be a function of the desired pH level for the solution, generally the addition agent will be present in the concentration of greater than 1 ppm, and preferably about 50 ppm.

The temperature of the basic solution may be maintained at a temperature in the range of from about room temperature to about 100° C. While the time of immersion in the basic solution may vary from about 1 second to about 120 seconds, most preferably, it is immersed for about 5 seconds to about 30 seconds. While the addition agent may be selected from those mentioned above, preferably, the solution is formed by using 50 ppm of $Ca(OH)_2$.

Upon exiting the tank 58 containing the basic rinse solution, the foil 10 may be dried at a drying station 70 and then coiled on a take up reel 72. Numerous drying processes which may be used are well known in the art. One such process which may be used embodies a water blow-off stage followed by a hot air tunnel drying stage. An alternative process which may be used utilizes heated blow-off air for both bulk and evaporative water removal. In this later process, the hot air can be directed against the foil when it is lying on drum rolls in the line. In still another alternative process, at least one internally heated drum roll or infra-red heating may be used to dry the foil. Any of these drying process may be incorporated into the drying station 70.

The foil 10, treated in accordance with the process described in connection with FIG. 1, may be transferred on its take up reel 72 to the treatment line shown in FIG. 2. The treatment shown in FIG. 2 may immediately follow the treatment according to FIG. 1 or may be delayed. Additionally, the treatment of Figure may be in line with that of FIG. 1 or may be a separate line at a completely different location.

The foil 10 is first fed through a rinsing tank 74 by a series of rolls 76, 78, 80, 82 and 4. The rinse serves to weaken the previously applied anti-tarnish treatment applied in the first stage of the process. In this treatment, the foil 10 is immersed in a dilute solution 86 of sulfuric acid. The solution in this tank may be the same as in tank 34. The solution may comprise from about 1.0 to 50 percent by weight sulfuric acid, and preferably about 5–15 percent by weight. While the temperature of the solution and the amount of time of immersion of the metal foil 10 within the solution 86 may vary. It is preferred that the temperature of the solution in the tank be maintained from about 35° to about 40° C. and that the immersion of the foil takes place for about 1 to about 120 seconds and preferably from about 5 to about 30 seconds.

The sulfuric acid rinse of this step serves to remove any oxidation or tarnishing which may have occurred between the time the foil was dried at the end of the first stage of treatment until the time it begins the second stage of its treatment. In addition, the sulfuric acid rinse serves to weaken the previously applied anti-tarnish treatment so that the forthcoming nodular treatment will be adherent and also conditions the metal foil pH for subsequent plating.

After the sulfuric acid rinse, the foil 10 is passed from the rinse tank 74 to a treatment tank 88 where a dendritic treatment is applied to the foil. Although any suitable dendritic or nodular treatment using any suitable apparatus known in the art such as electrochemical cell may be used to form a plurality of dendritic or nodular structures on the foil surface or surfaces, the preferred technique for forming the dendritic or nodular structures and for bonding them to the foil surfaces is more fully described in U.S. Pat. No. 4,468,293 to Polan et al. This patent is incorporated by reference herein in its entirety.

The dendritic or nodular treatment comprises electrodeposition of a plurality of dendritic or nodular surfaces on at least one surface of the foil and bonding of the dendritic or nodular surface thereto. To perform this dendritic or nodular treatment, the foil is passed through an electrolyte solution 90 in a tank 88 and rendered cathodic such as by contacting one or more conductive rolls electrically connected to the negative terminal of a suitable power source 92. The foil may be passed through the solution 90 in any suitable manner such as by a plurality of rolls 94, 96, 98 and 100. Since it is preferred to form the dendrites by applying a cathodic current to the foil, one or more anodes 102 may be immersed in the electrolyte solution 90 and connected to the positive terminal of the power supply 92.

The electrolytic solution 90 comprises a solution containing copper. In a preferred embodiment, a copper sulfate-sulfuric acid solution is used. The solution may be maintained at a temperature between 20° C. and 90° C. with the concentration of copper in the solution being in the range of about 10 g/l to about 120 g/l. Below a copper concentration of about 10 g/l, the current efficiency becomes too low to reasonably perform the process. Above the saturation point, the copper sulfate precipitates and it become substantially impossible to get more copper into the solution. In the preferred embodiment, the concentration of copper in the solution at 30°–45° C. in range of about 30 g/l to about 60 g/l.

The sulfuric acid in the solution 90 may have a concentration up to that which causes copper to precipitate out as copper sulfate. In a preferred embodiment, the concentration of sulfuric acid is about 40 g/l to about 120 g/l for a solution between 30° C. to about 45° C.

It should be recognized that the copper and sulfuric acid concentrations are dependent upon the temperature of the bath solution. If desired, the tank 88 may be provided with any well known, conventional means (not shown) for maintaining the temperature of the solution at a desired level. The copper and sulfuric acid concentrates discussed above may be adjusted if the solution is maintained at higher or lower temperatures.

At elevated temperatures, the concentration of copper could be proportionally higher as the solubility limit increases with temperature.

In the preferred form of the invention, the dendritic deposition is applied to only one face of the metal foil which is the outer or solution side of the electrodeposited foil. The anode 102 is provided in the tank 82 facing the solution side of the foil as shown. The current, provided from the power supply 92, is applied to the cell as an uninterrupted multi-cycle, fluctuating current having a cathodic portion with first and second current densities each with a magnitude greater than zero and flowing in only one direction.

The current density required for producing a desired dendritic layer is dependant upon the concentration and operating temperature of the electrolyte solution 90. The first magnitude of the current density should be above the magnitude of the limiting current density while the second magnitude of the current density is preferably below the magnitude of the limiting current density. The limiting current density may be defined as the maximum current density at which the dischargeable metal species, in this case copper ions, is substantially depleted at the surface of the metal foil or sheet. If the solution temperature is raised, the current density would have to be raised accordingly. If the copper concentration were lowered, or the sulfuric acid concentration were increased, the required current density would be lower.

In this particular case, the preferred current densities slightly exceed those set forth as preferred in U.S. Pat. No. 4,468,293. This is because the effective surface area in this particular case is much larger than that of smooth wrought foil and the apparent current density must therefore be raised according to a preferred embodiment. For example, the first current density may be 330 mA/cm$^2$ and the second or base current density 100 mA/cm$^2$ at 20 Hz. The foil may be subjected to the fluctuating current treatment for a period of time ranging from about 2 seconds to about 100 seconds and preferably about 12 seconds.

If desired, after the dendritic or nodular deposition, a layer of zinc, brass, nickel or other material may be applied over the dendrites to aid in the bonding of the foil to certain types of substrates. Additionally, the foil may be subjected to an anti-tarnish treatment.

According to a preferred embodiment after the dendritic deposition treatment, the foil 10 may be rinsed with deionized water at a rinse station 104 and then passed by means of a series of rolls 106, 108, 110 and 112 through a zinc plating treatment tank 114 containing an appropriate zinc plating solution 116 therein. This treatment serves to apply a relatively heavy coating of zinc to the rough or solution side of the foil 10 while a thin coating of zinc is applied to the smooth or drum side of the foil. The thin layer of zinc on the smooth side is in the order of from about 0.001 to about 0.06 mg/cm$^2$ and serves as an anti-tarnish treatment in conjunction with the next step. The heavy coating of zinc may be in the order of from about 0.3 to about 3.0 g/m$^2$ and preferably about 0.5 to about 2 g/m$^2$.

The zinc plating solution 116 comprises a suitable form of zinc, preferably in the form of zinc sulfate. The zinc sulfate is dissolved in water to form a aqueous solution of from about 0.01M to about 1.5M. The desired zinc deposit is greater on the front or rough side of the foil as compared with the back, or smooth side, and this may be accomplished in a number of ways. The foil is rendered cathodic by contacting one or more rolls electrically connected to the negative terminal of a suitable power supply 118. Two separate sets of anodes 120 and 122 may be used, one 120 facing the smooth or drum side of the foil and the second 122 facing the roughened or dendritic side of the foil. The anodes 120 and 122 are connected to positive terminals of the power supply 118 which provides the proper current density.

The current density applied to the front side of the foil may be between 5 to about 150 mA/cm$^2$ and preferably around 40 mA/cm$^2$ while the current density applied to the back or smooth side of the foil is from about 0.01 to about 100 mA/cm$^2$ and preferably around 5 mA/cm$_2$. To provide for the thicker layer on the front side as compared with the back, in addition to using a higher current density, the length of time at which the front surface of the foil 10 may be subjected to the plating treatment may be longer than the back. This can be accomplished in a variety of ways, one of which is by having the length of the anodes 122 facing the front or roughened side longer than the anode 120 on the back or smooth side. With the temperature of the plating solution in the range of about 35° to 40° C., the current density may be applied to the front side in the order of from about 2 to about 100 seconds and preferably 10 seconds while the current density may be applied to the back side in range from about 0.1 to about 100 seconds and preferably about 5 seconds.

After the zinc plating treatment, the foil 10 may passes through a rinse station 124 wherein it is rinsed in deionized water. The rinse station 124 may be identical in construction to the rinse stations 44, 70 and 04. Such stations may include a plurality of spray nozzles (not shown) arranged to spray deionized water on both side of the foil 10. While such nozzles may be arranged in any suitable configuration and may have any desired nozzle pattern it is preferred that the nozzles be arranged in banks of adjacent square pattern nozzles on opposite sides of the foil 10. Alternatively, the rinse station may comprise a tank containing the rinse solution and through which the foil is passed.

After the rinse station 124, the foil 10 is immersed in a tank 126 containing a chromic acid-sulfuric acid solution 128. The foil is passed through the tank by means of suitable rolls 130, 132, 134 and 136. In accordance with the present invention, the solution 128 in the tank contains chromic acid in a concentration of about 0.02 g/l to about 100 g/l and sulfuric acid in the concentration in the range of about 0.02 g/l to about 20 g/l depending upon the temperature and length of time of treatment. Generally the solutions contain no other constituents besides water and some minor impurities. Preferably, the solution consists essentially of from about 0.1 g/l to about 0.3 g/l of chromic acid, from about 0.02 to about 0.7 g/l of sulfuric acid and the balance essentially water.

While the foil may be treated with the chromic acid-sulfuric acid solution at any desired temperature, it is preferred that the solution 128 in the tank be maintained at an elevated temperature in the range of 50° to 55° C. With this temperature and the concentrations of chromic acid being 0.2 g/l and the sulfuric acid being 0.05 g/l, the foil may be immersed in the solution for about 20 seconds.

It has been found that the use of sulfuric acid in this step enhances the reaction of the $Cr^{+6}$ with the metal surface and does not have a deleterious reaction with the zinc layer. The use of phosphoric acid in place of the sulfuric acid, while providing relatively good tarnish resistance, results in a relatively inferior peel strength believed to be caused by the chemical reaction of the zinc sulfuric acid and calcium hydroxide used in the next step.

In place of the sulfuric acid in the chromic acid-sulfuric acid solution, other sulfate compounds may be used such as sodium sulfate or ammonium sulfate in amounts to provide a sulfate concentration of from about 0.02 g/l to about 20 g/l.

After treatment of the foil 10 with the chromic acid-sulfuric acid solution, the foil 10 may be further treated by immersion in a tank 138 containing a dilute aqueous solution 140 having a pH greater than about 8. A plurality of rolls 142, 144, 146 and 148 may be used to define the path by which the foil tracts through the tank.

The dilute basic solution 140 used for this step is substantially the same as that used in the last step prior to drying during the first stage of the process as discussed in connection with FIG. 1. However, in this case, the temperature may be maintained between about 45° to about 50° C. It has been found that the use of the basic rinse solution after treatment with the chromic acid-sulfuric acid bath serves to enhance the anti-tarnish treatment.

After the foil 10 exits from the tank 138 containing the basic rinse, it passes through a drying station 150, positioned between the rolls 148 and 152. The drying station 150 is of a type similar to drying station 70 heretofore described. The foil 10 is then wound onto a take up reel 154.

By way of an example, electrodeposited foil was rinsed in dilute sulfuric acid, rinsed in deionized water and then immersed in a chromic acid-phosphoric acid solution containing about chromic acid and phosphoric acid for about 20 seconds while the bath was maintained at 40 +/−3° C. The foil was thereafter immersed in a solution of $Ca(OH)_2$ solution at 50 parts per million for about 20 seconds while the bath was maintained at about 40° C. and then dried. The foil was then later transferred to a second stage treatment line where it was rinsed in a dilute sulfuric acid solution and then subjected to dendritic deposition on its rough, solution side utilizing a fluctuating current treatment similar to that set forth in U.S. Pat. No. 4,468,293. The first current density was 330 $mA/cm^2$ while the second current density was 100 $mA/cm^2$. The solution consisted of 50 g/l copper in the form of copper sulfate and 100 g/l sulfuric acid and was maintained between 35° to 40° C. The current applied was 20 Hz and the foil was subjected to the treatment for about 12 seconds.

After the dendritic deposition treatment, the foil was again rinsed in deionized water and then subjected to zinc plating whereupon a relatively thin plating of zinc was applied utilizing a 0.6M aqueous solution of zinc sulfate. A relatively thick coating was applied to the front or roughened side utilizing a current density of 40 $mA/cm^2$ and a relatively thin coating was placed on the back or smooth side utilizing a current density of 5 $mA/cm^2$ for 5 seconds. The foil was therefore rinsed and immersed in a chromic acid-sulfuric acid solution at a concentration of 0.2 g/l chromic acid and 0.05 g/l sulfuric acid which was maintained between 50° to 55° C. The foil was treated for 20 seconds and then immersed in a 50 ppm solution of calcium hydroxide maintained at 45° to 50° C. for about 20 seconds. The foil was then dried.

It was found that with the use of the pretreatment of chromic acid-phosphoric acid prior to the dendritic treatment, peel strength increases of 0.5 to 1.5 pounds per inch were achieved. In addition, the zinc plating on the back side followed by the treatment in the chromic acid-sulfuric acid solution followed by immersion in the basic solution, resulted in superior tarnish resistance and high peel strength. No discolorization occurred after 96 hours at 90 percent relative humidity and 60° C. and the strength of the foil containing the thin zinc coating on the smooth side was about 12 lbs/in.

The U.S. Patent and Foreign Patent documents described in the specification are intended to be incorporated herein by reference in their entirety.

While the invention has been described above in combination with specific embodiments thereof, it is evident that many alterations, modifications and variations will be apparent to those skilled in the art in like of the forgoing description. Accordingly, it is intended to embrace all alternatives, modifications and variations as fall within the spirit and broad scope of the appended claims.

What is claimed is:

1. A process of treating metal foil comprising applying an aqueous chromic acid solution to said foil, said solution having a concentration of chromic acid in the range of about 0.002 g/l to about 1.0 g/l and thereafter forming a plurality of copper or copper oxide dentritic or nodular structures on at least one surface of said foil.

2. The process of claim 1 further comprising applying an aqueous rinse solution to said foil after applying said chromic acid solution and before forming said dendritic or nodular structures, said rinse solution having a pH of at least 8.

3. The process of claim 2 wherein said aqueous rinse solution comprises an aqueous solution having a pH in the range of about 9 to about 11.5 and temperature in the range of about room temperature to about 100° C.

4. The process of claim 2 wherein said rinse solution contains a material selected from the group consisting of the salts of alkali metals, the salts of alkaline earth metals, the hydroxides of the alkali metals, and the hydroxides of the alkaline earth metals.

5. The process of claim 2 wherein said rinse solution contains at least 1 ppm of a material selected from the group consisting of calcium hydroxide, sodium hydroxide, potassium hydroxide, and ammonium hydroxide.

6. The process of claim 2 further comprising rinsing said foil in a dilute solution of sulfuric acid after said aqueous rinse and before forming said structure.

7. The process of claim 6 wherein said sulfuric acid solution comprises from about 1.0 to about 50 percent by weight sulfuric acid.

8. The process of claim 7 wherein said sulfuric acid solution comprises from about 5 to about 15 percent by weight.

9. A process of treating metal foil comprising applying an aqueous solution of chromic acid and phosphoric acid to said foil, said solution having a concentration of chromic acid in the range of about 0.002 g/l to about 1.00 g/l and a concentration of phosphoric acid in the range of about 0.002 g/l to about 1.00 g/l, thereafter forming a plurality of copper or copper oxide dentritic or nodular structures on at least one surface of said foil.

10. The process of claim 9 further comprising applying an aqueous rinse solution to said foil after applying said chromic acid phosphoric acid solution and before forming said dentritic or nodular structures, said rinse solution having a pH of at least 8.

11. The process of claim 10 wherein said rinsing step comprises applying an aqueous solution having a pH in the range of about 9 to about 11.5 and a temperature in the range of about room temperature to about 100° C.

12. The process of claim 10 wherein said rinse solution contains a material selected from the group consisting of the salts of alkali metals, the salts of alkaline earth metals, the hydroxides of the alkali metals, and the hydroxides of the alkaline earth metals.

13. The process of claim 10 wherein said rinse solution contains at least 1 ppm of a material selected from the group consisting of calcium hydroxide, sodium hydroxide, potassium hydroxide, and ammonium hydroxide.

14. The process of claim 10 further comprising rinsing said foil in a dilute solution of sulfuric acid after said aqueous rinse and before forming said structure.

15. The process of claim 14 wherein said sulfuric acid solution comprises from about 1.0 to about 50 percent by weight sulfuric acid.

16. The process of claim 15 wherein said sulfuric acid solution comprises from about 5 to about 15 percent by weight.

17. The process of claim 9 wherein said acid solution applying step comprises immersing said material in said acid solution for a time in the range of about 1 second to about 120 seconds.

18. The process of claim 9 wherein said acid solution applying step comprises immersing said material in said acid solution while said acid solution in at a temperature in the range of about ambient temperature to about 90° C. for a time period in the range of about 5 seconds to about 20 seconds.

19. The process of claim 9 wherein said acid solution applying step comprises immersing said foil in a solution obtaining from about 0.1 g/l to about 0.3 g/l of said chromic acid and from about 0.1 g/l to about 0.5 g/l of said phosphoric acid.

20. The process of claim 9 wherein said dentritic or nodular forming step comprises electrolytically forming a layer of nodular copper or copper oxide particles on said at least one surface and bonding the particles thereto.

21. The process of claim 9 wherein said nodular or dendritic structures are applied to one side of said foil, said process further comprising applying a layer of zinc on at least the side of said foil opposite said side having said structures thereon, and thereafter treating said foil with a solution of chromic acid and sulfuric acid.

22. The process of claim 21 wherein said layer of zinc is from about 0.06 to about 0.003 mg/cm$^2$.

23. The process of claim 21 wherein the layer of zinc is applied to both sides of said foil, the side of the foil having said structures thereon, said layer of zinc on said structure side of said being thicker than said layer on said other side.

24. The process of claim 21 wherein said chromic acid/sulfuric acid solution has a concentration of chromic acid in the range of about 0.02 g/l to about 100 g/l and a concentration of sulfuric acid in the range of about 0.02 g/l to about 20 g/l.

25. The process of claim 24 wherein said concentration of said chromic acid is from about 0.1 g/l to about 0.3 g/l and the concentration of said sulfuric acid is about 0.02 g/l to about 0.7 g/l.

26. The process of claim 21 further comprising applying an aqueous rinse solution to said foil having a pH of at least 8.

27. The process of claim 26 wherein said rinsing step comprises applying an aqueous solution having a pH in the range of about 9 to about 11.5 and temperature in the range of about room temperature to about 100° C.

28. The process of claim 26 wherein said rinse solution contains a material selected from the group consisting of the salts of alkali metals, the salts of alkaline earth metals, the hydroxides of the alkali metals, and the hydroxides of the alkaline earth metals.

29. The process of claim 26 wherein said rinse solution contains at least 1 ppm of a material selected from the group consisting of calcium hydroxide, sodium hydroxide, potassium hydroxide, and ammonium hydroxide.

30. The process of claim 9 wherein said nodular or dendritic structures are applied to one side of said foil, said process further comprising applying a layer of zinc on at least the side of said foil opposite said side having said structures therein, and thereafter treating said foil with a solution of chromic acid and a sulfate compound.

31. The process of claim 21 wherein said solution of chromic acid and a sulfate compound has a concentration of chromic acid in the range of abut 0.02 g/l to about 100 g/l and a sulfate concentration in the amount of about 0.02 g/l to about 20 g/l.

* * * * *

UNITED STATES PATENT AND TRADEMARK OFFICE
CERTIFICATE OF CORRECTION

PATENT NO. : 4,961,828

DATED : October 9, 1990

INVENTOR(S) : Lifun Lin and Ned W. Polan

It is certified that error appears in the above—identified patent and that said Letters Patent is hereby corrected as shown below:

At Column 3, line 5, after "or copper", delete "alloys" and insert --alloy--.

At Column 3, line 7, after "foil", delete "," and insert --.--.

At Column 3, line 35, after "conductive metal", delete "or metal".

At Column 3, line 37, after "lead", insert --,--.

At Column 3, line 61, after "ranges", insert --in--.

At Column 3, line 62, after "U.S. Pat." insert --to Polan-- and after "No. 4,529,486" delete "to Polan".

At Column 4, line 50, after "may", delete "applied" and insert --apply--.

At Column 4, line 53, after "48 be", delete "maintain" and insert --maintained--.

At Column 5, line 55, after "Figure", insert --2--.

At Column 5, line 59, after "82 and", delete "4" and insert --84--.

UNITED STATES PATENT AND TRADEMARK OFFICE
CERTIFICATE OF CORRECTION

PATENT NO. : 4,961,828

DATED : October 9, 1990

INVENTOR(S) : Lifun Lin and Ned W. Polan

It is certified that error appears in the above—identified patent and that said Letters Patent is hereby corrected as shown below:

At Column 5, line 68, after "vary", delete ". It" and insert --, it--.

At Column 6, line 60, after "between", insert --about--.

At Column 7, line 15, after "is", delete "dependant" and insert --dependent--.

At Column 7, line 64, after "form", delete "a" and insert --an--.

At Column 8, line 15, delete "mA/cm2" and insert --mA/$cm^2$--.

At Column 8, line 31, delete "passes" and insert --pass--.

At Column 8, line 33, after "70 and", delete "04" and insert --104--.

At Column 8, line 35, after "both", delete "side" and insert --sides--.

At Column 8, line 42, after "tion", delete "and".

At Column 10, line 19, after "art", delete "in like of the forgoing" and insert --in light of the foregoing--.

UNITED STATES PATENT AND TRADEMARK OFFICE
CERTIFICATE OF CORRECTION

PATENT NO. : 4,961,828

DATED : October 9, 1990

INVENTOR(S) : Lifun Lin and Ned W. Polan

It is certified that error appears in the above—identified patent and that said Letters Patent is hereby corrected as shown below:

At Column 10, Claim 1, line 5, after "copper oxide", delete "dentritic" and insert --dendritic--.

At Column 10, Claim 9, line 7, after "copper oxide", delete "dentritic" and insert --dendritic--.

At Column 11, Claim 18, line 3, after "acid solution" delete "in" and insert --is--.

At Column 12, please replace Claim 23 with the following:

--23. The process of claim 21 wherein the layer of zinc is applied to both sides of said foil, said layer of zinc on the side of the foil having said structures thereon being thicker than said layer on said other side.--

At Column 12, Claim 31, line 1, after "claim", delete "21" and insert --30--.

Signed and Sealed this

Twenty-first Day of July, 1992

Attest:

DOUGLAS B. COMER

Attesting Officer

Acting Commissioner of Patents and Trademarks